United States Patent
Nishikawa et al.

(10) Patent No.: US 9,837,431 B2
(45) Date of Patent: Dec. 5, 2017

(54) 3D SEMICIRCULAR VERTICAL NAND STRING WITH RECESSED INACTIVE SEMICONDUCTOR CHANNEL SECTIONS

(71) Applicant: SANDISK TECHNOLOGIES INC., Plano, TX (US)

(72) Inventors: Masatoshi Nishikawa, Yokkaichi (JP); Hiroaki Iuchi, Yokkaichi (JP); Masafumi Miyamoto, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/008,744

(22) Filed: Jan. 28, 2016

(65) Prior Publication Data

US 2017/0148805 A1   May 25, 2017

Related U.S. Application Data

(60) Provisional application No. 62/257,885, filed on Nov. 20, 2015.

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/02164* (2013.01); *H01L 21/02274* (2013.01);
(Continued)

(58) Field of Classification Search
CPC ........ H01L 27/11568; H01L 27/11582; H01L 29/518; H01L 21/28282; H01L 21/02164;
(Continued)

(56) References Cited

U.S. PATENT DOCUMENTS 5,915,167 A   6/1999 Leedy
7,575,973 B2   8/2009 Mokhlesi et al.
(Continued)

FOREIGN PATENT DOCUMENTS

WO   WO2016053453 A1   4/2016

OTHER PUBLICATIONS

International Search Report and Written Opinion of the International Searching Authority for International Application No. PCT/US2016/049771, dated Dec. 1, 2016, 14 pages.
(Continued)

*Primary Examiner* — Nathan W Ha
(74) *Attorney, Agent, or Firm* — The Marbury Law Group PLLC

(57) ABSTRACT

A vertical memory device including dual memory cells per level in each memory opening can have dielectric separator dielectric structures that protrude into a facing pair of sidewalls of the memory stack structure within the memory opening. A pair of inactive sections of a vertical semiconductor channel facing the dielectric separator dielectric structures is laterally recessed from control gate electrodes. Control of the threshold voltage of such a vertical memory device can be enhanced because of the dielectric separator dielectric structures. The fringe field from the control gate electrodes is weaker due to an increased distance between the control gate electrodes and the inactive sections of the vertical semiconductor channel. The memory stack structure can have concave sidewalls that contact the dielectric separator dielectric structures and convex sidewalls that protrude toward the control gate electrodes.

24 Claims, 12 Drawing Sheets

(51) Int. Cl.
*H01L 21/02* (2006.01)
*H01L 21/28* (2006.01)
*H01L 21/311* (2006.01)
*H01L 27/11565* (2017.01)
*H01L 27/11519* (2017.01)
*H01L 27/11524* (2017.01)
*H01L 27/11556* (2017.01)
*H01L 27/1157* (2017.01)

(52) U.S. Cl.
CPC .. *H01L 21/28282* (2013.01); *H01L 21/31111* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 21/02274; H01L 27/11519; H01L 27/11524
See application file for complete search history.

(56) References Cited

U.S. PATENT DOCUMENTS

| | | | |
|---|---|---|---|
| 7,906,392 | B2 | 3/2011 | Dunton et al. |
| 8,187,936 | B2 | 5/2012 | Alsmeier et al. |
| 8,461,641 | B2 | 6/2013 | Alsmeier et al. |
| 8,823,076 | B2 | 9/2014 | Lee et al. |
| 8,853,765 | B2 | 10/2014 | Lee et al. |
| 8,981,457 | B2 | 3/2015 | Lee et al. |
| 8,987,119 | B2 | 3/2015 | Dunton et al. |
| 9,023,719 | B2 | 5/2015 | Pachamuthu et al. |
| 9,293,471 | B1 * | 3/2016 | Chen .................. H01L 27/11582 |
| 9,543,318 | B1 * | 1/2017 | Lu ..................... H01L 27/11582 |
| 2007/0029607 | A1 | 2/2007 | Kouznetzov |
| 2009/0230454 | A1 | 9/2009 | Pekny |
| 2011/0019480 | A1 * | 1/2011 | Kito .................. H01L 27/11565 365/185.18 |
| 2011/0156044 | A1 | 6/2011 | Lee et al. |
| 2012/0012921 | A1 | 1/2012 | Liu |
| 2012/0326221 | A1 | 12/2012 | Sinha |
| 2013/0140623 | A1 | 6/2013 | Lee et al. |
| 2013/0273728 | A1 * | 10/2013 | Kim .................. H01L 27/11521 438/591 |
| 2014/0070300 | A1 * | 3/2014 | Jang .................. H01L 27/11565 257/324 |
| 2014/0131784 | A1 | 5/2014 | Davis et al. |
| 2015/0044833 | A1 | 2/2015 | Lee et al. |
| 2015/0076584 | A1 | 3/2015 | Pachamuthu et al. |
| 2015/0179660 | A1 | 6/2015 | Yada et al. |
| 2015/0380418 | A1 | 12/2015 | Zhang et al. |
| 2016/0071876 | A1 * | 3/2016 | Mizuno ............. H01L 27/11582 365/185.17 |
| 2016/0079185 | A1 * | 3/2016 | Kato ................. H01L 21/76877 257/314 |
| 2016/0141299 | A1 * | 5/2016 | Hong ................ H01L 27/11578 257/324 |
| 2016/0315097 | A1 * | 10/2016 | Hsu .................... G11C 16/0483 |

OTHER PUBLICATIONS

U.S. Appl. No. 14/721,198, filed May 26, 2015, SanDisk Technologies Inc.
U.S. Appl. No. 14/748,575, filed Jun. 24, 2015, SanDisk Technologies Inc.
U.S. Appl. No. 14/748,670, filed Jun. 24, 2015, SanDisk Technologies Inc.
U.S. Appl. No. 14/808,229, filed Jul. 24, 2015, SanDisk Technologies Inc.
Invitation to Pay Additional Fees and Annex to Form PCT/ISA/206 Communication Relating to Results of the Partial International Search for PCT/US2015/042220, dated Oct. 13, 2015.

* cited by examiner

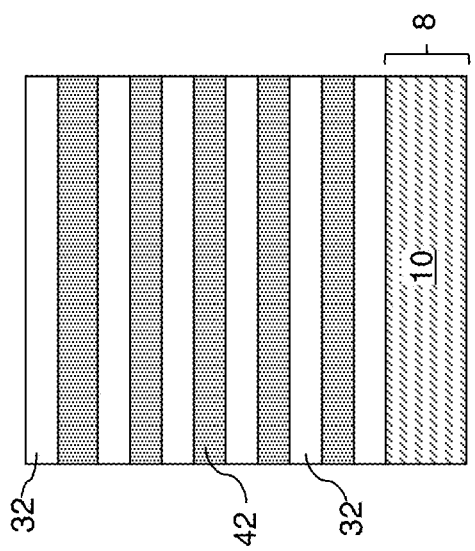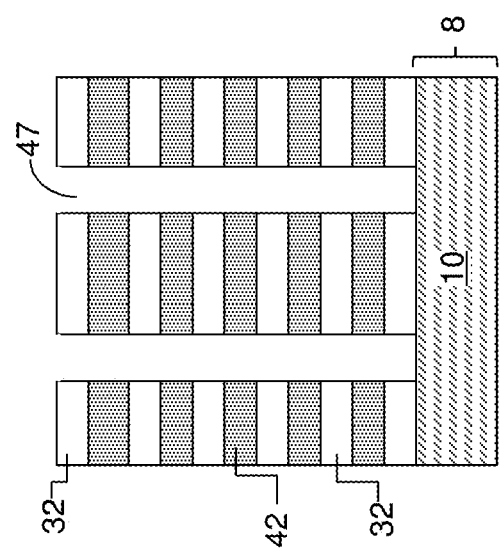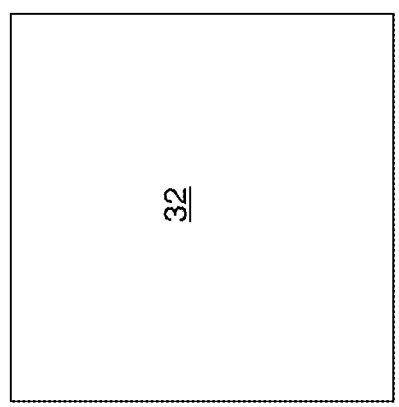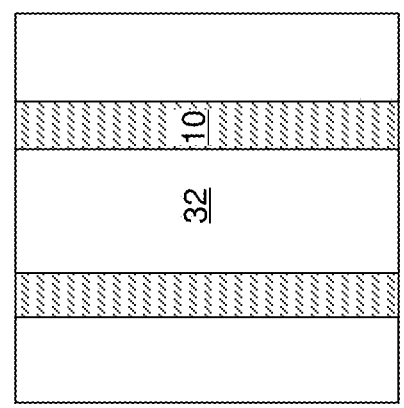

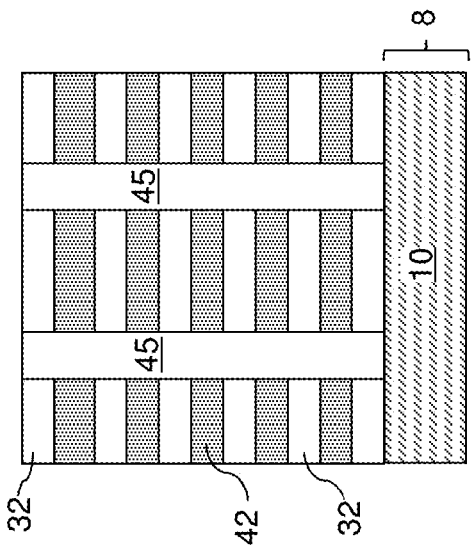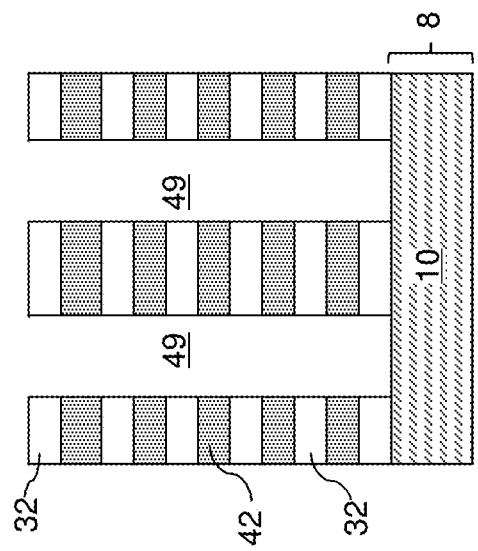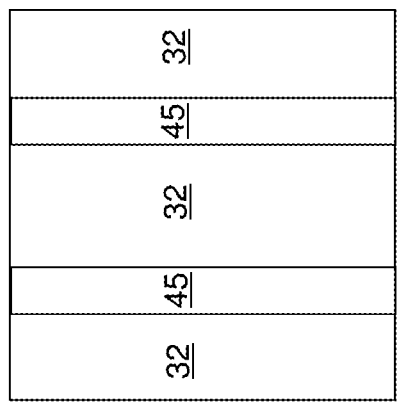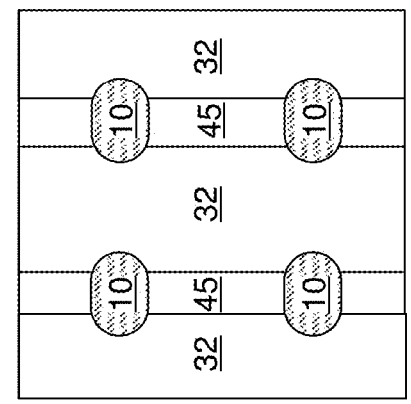

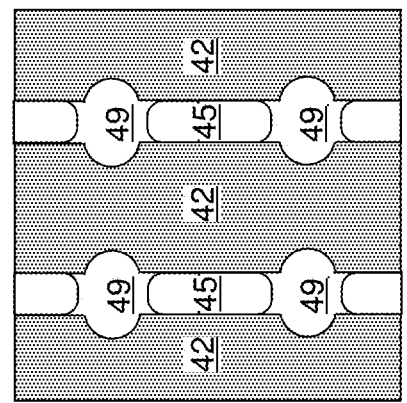
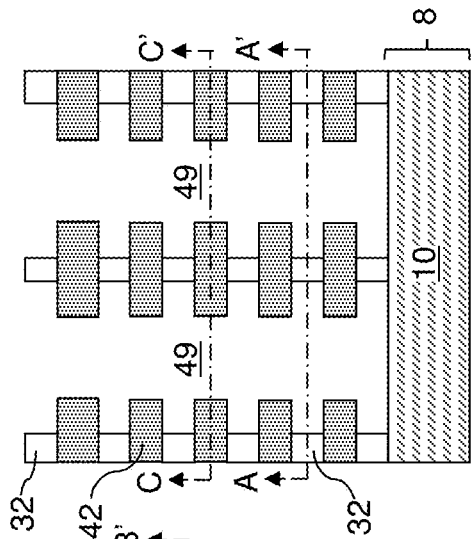
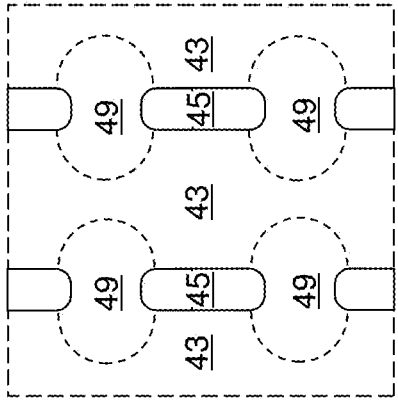
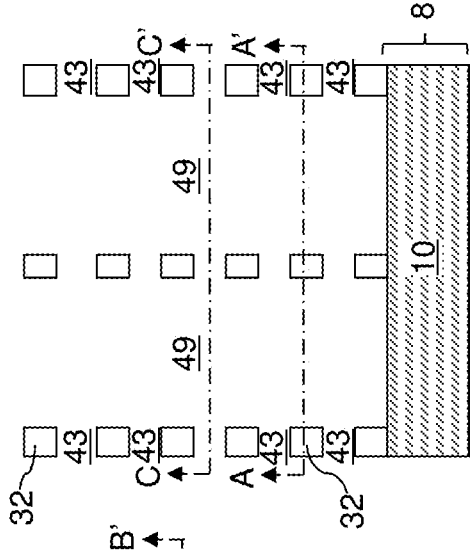
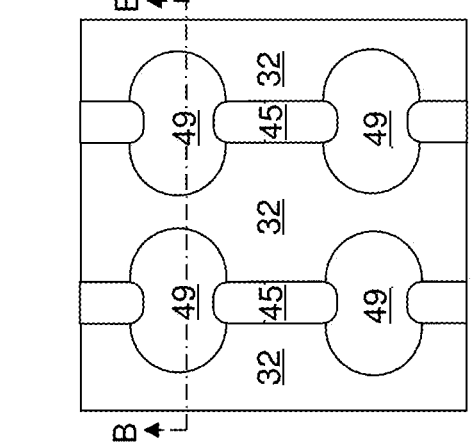
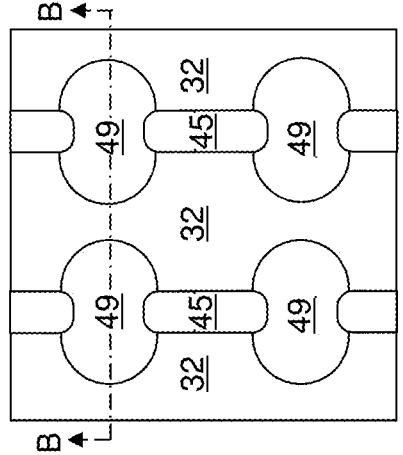

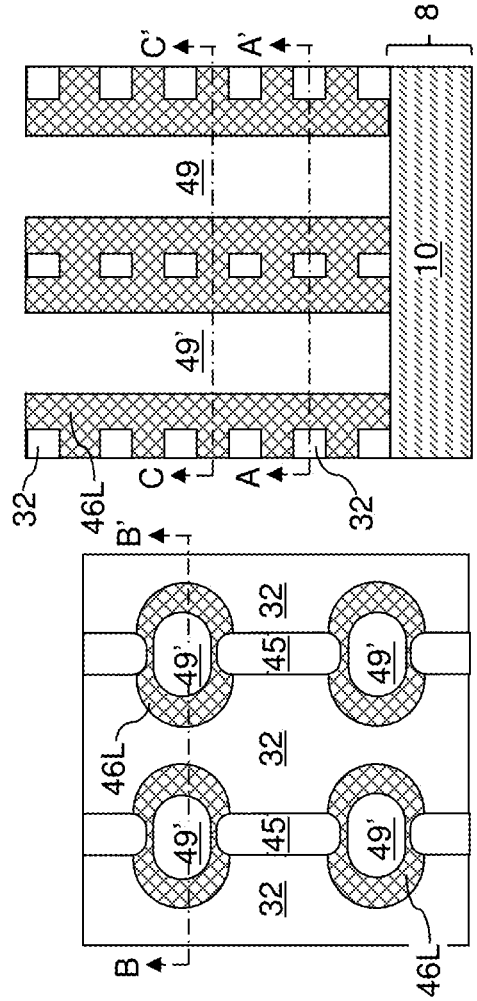

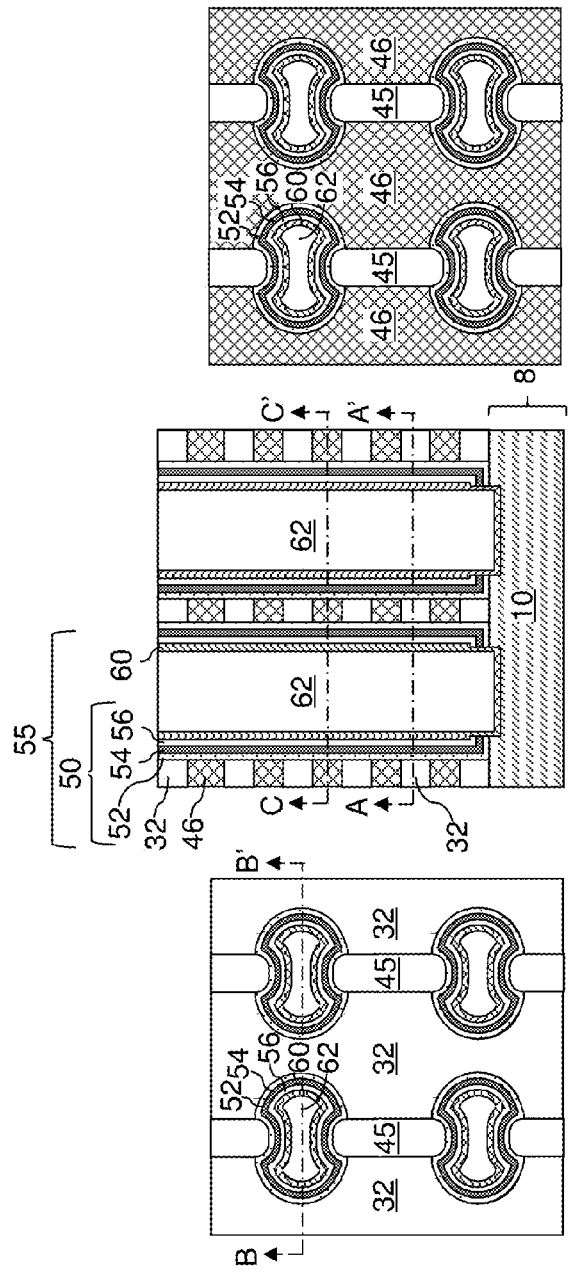
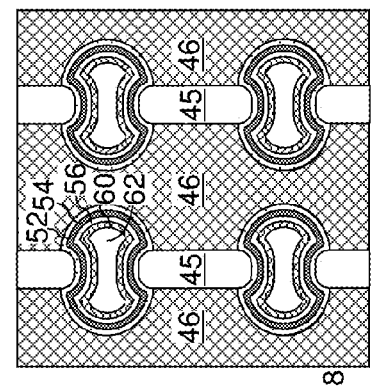
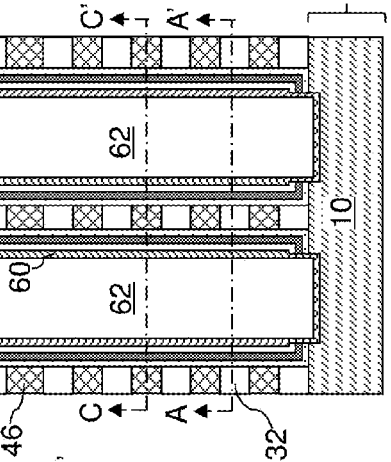
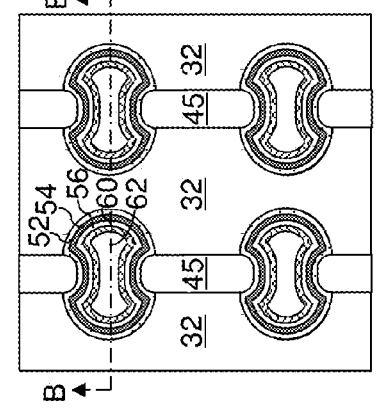

3D SEMICIRCULAR VERTICAL NAND STRING WITH RECESSED INACTIVE SEMICONDUCTOR CHANNEL SECTIONS

RELATED APPLICATIONS

This application claims the benefit of priority of U.S. Provisional Application No. 62/257,885 filed on Nov. 20, 2015, which is incorporated herein by reference in its entirety.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a memory device is provided, which comprises: an alternating stack of insulating layers and electrically conductive layers located over a substrate; a pair of separator dielectric structures extending through the alternating stack and laterally extending along a first lateral direction; and a memory stack structure including a memory film and a vertical semiconductor channel, extending through the alternating stack, having a pair of first sidewalls that contact sidewalls of the pair of separator dielectric structures, and having a pair of second sidewalls that protrude outward along a second lateral direction. The first sidewalls are laterally recessed inward from substantially vertical edges of the pair of second sidewalls.

According to another aspect of the present disclosure, a method of making a memory device is provided. An alternating stack of insulating layers and sacrificial material layers is formed over a substrate. A plurality of separator dielectric structures arranged along a first lateral direction and laterally spaced apart by memory openings is formed through the alternating stack. Sidewalls of the insulating layers are laterally recessed at a greater etch rate than sidewalls of the plurality separator dielectric structures around the memory openings. The sacrificial material layers are replaced with electrically conductive layers. A memory stack structure including a memory film and a vertical semiconductor channel is formed in each of the memory openings.

BRIEF DESCRIPTION OF THE DRAWINGS

FIG. 2A is a top-down view of an exemplary device structure after formation of an alternating stack of insulating layers and semiconductor layers according to an embodiment of the present disclosure.

FIG. 2B is a vertical cross-sectional view of the exemplary device structure of FIG. 2A.

FIG. 3A is a top-down view of an exemplary device structure after formation of laterally-extending trenches according to an embodiment of the present disclosure.

FIG. 3B is a vertical cross-sectional view of the exemplary device structure of FIG. 3A.

FIG. 4A is a top-down view of the exemplary device structure after formation of separator dielectric structures according to an embodiment of the present disclosure.

FIG. 4B is a vertical cross-sectional view of the exemplary device structure of FIG. 4A.

FIG. 5A is a top-down view of the exemplary device structure after formation of memory openings according to an embodiment of the present disclosure.

FIG. 5B is a vertical cross-sectional view of the exemplary device structure of FIG. 5A.

FIG. 6A is a top-down view of the exemplary device structure after selective lateral expansion of the memory openings according to an embodiment of the present disclosure.

FIG. 6B is a vertical cross-sectional view along the vertical plane B-B' of the exemplary device structure of FIG. 6A.

FIG. 6C is a horizontal cross-sectional view of the exemplary device structure along the horizontal plane C-C' of FIG. 6B.

FIG. 7A is a top-down view of the exemplary device structure after removal of the sacrificial material layers according to an embodiment of the present disclosure.

FIG. 7B is a vertical cross-sectional view along the vertical plane B-B' of the exemplary device structure of FIG. 7A.

FIG. 7C is a horizontal cross-sectional view of the exemplary device structure along the horizontal plane C-C' of FIG. 7B.

FIG. 8A is a vertical cross-sectional view of the exemplary device structure after deposition of a continuous conductive material layer according to an embodiment of the present disclosure along the horizontal plane A-A' of FIG. 8B.

FIG. 8B is a vertical cross-sectional view along the vertical plane B-B' of the exemplary device structure of FIG. 8A.

FIG. 8C is a horizontal cross-sectional view of the exemplary device structure along the horizontal plane C-C' of FIG. 8B.

FIG. 9A is a vertical cross-sectional view of the exemplary device structure after removal of portions of the continuous conductive material layer from within the memory openings according to an embodiment of the present disclosure along the horizontal plane A-A' of FIG. 9B.

FIG. 9B is a vertical cross-sectional view along the vertical plane B-B' of the exemplary device structure of FIG. 9A.

FIG. 9C is a horizontal cross-sectional view of the exemplary device structure along the horizontal plane C-C' of FIG. 9B.

FIG. 10A is a vertical cross-sectional view of the exemplary device structure after formation of memory stack structures and dielectric cores according to an embodiment of the present disclosure along the horizontal plane A-A' of FIG. 10B.

FIG. 10B is a vertical cross-sectional view along the vertical plane B-B' of the exemplary device structure of FIG. 10A.

FIG. 10C is a horizontal cross-sectional view of the exemplary device structure along the horizontal plane C-C' of FIG. 10B.

FIG. 11A is a vertical cross-sectional view of the exemplary device structure after formation of drain regions according to an embodiment of the present disclosure along the horizontal plane A-A' of FIG. 11B.

FIG. 11B is a vertical cross-sectional view along the vertical plane B-B' of the exemplary device structure of FIG. 11A.

FIG. 11C is a horizontal cross-sectional view of the exemplary device structure along the horizontal plane C-C' of FIG. 11B.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
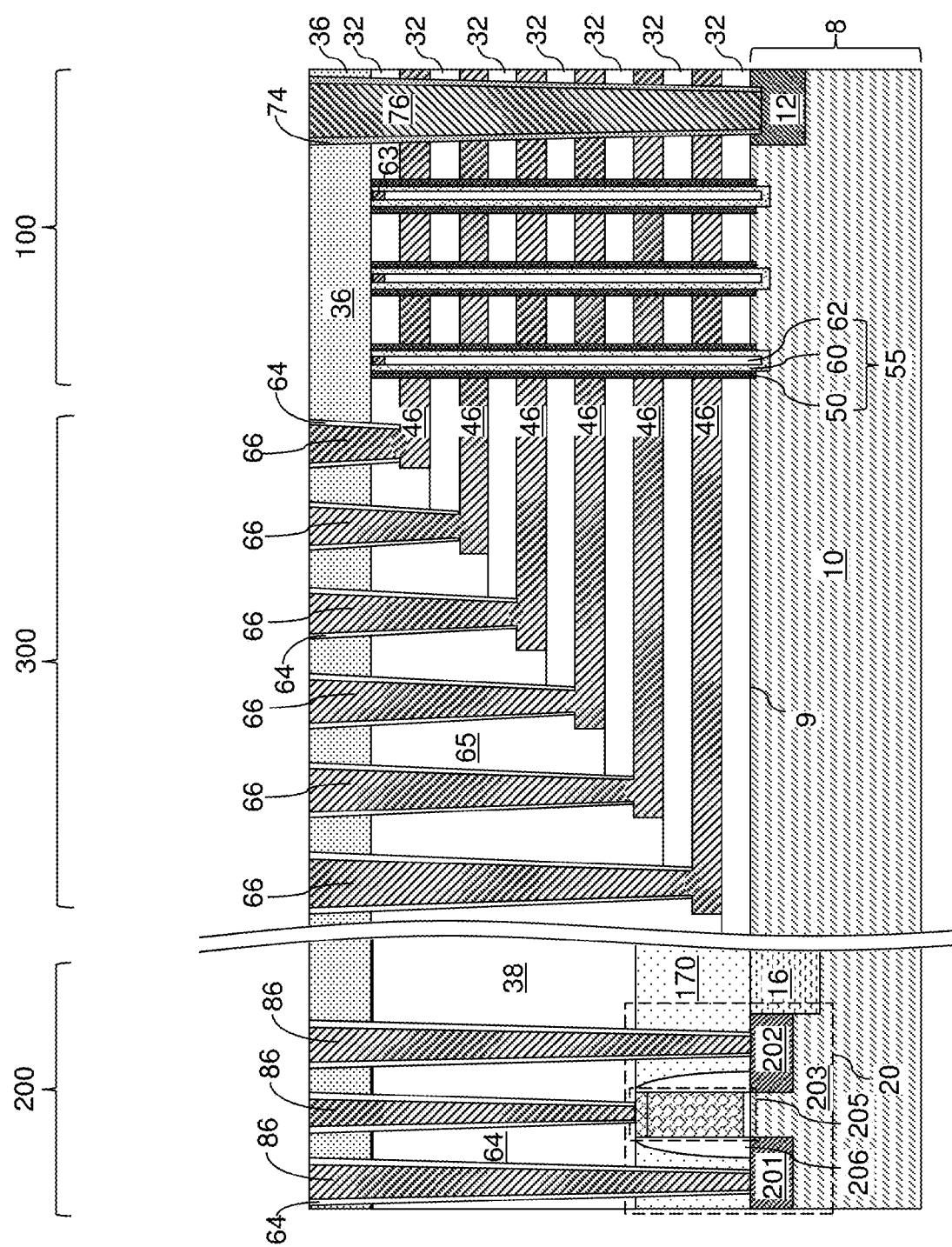
FIG. 1 is a vertical cross-section of an exemplary device structure containing a 3D NAND stacked memory device according to embodiments of the present disclosure.

Referring to FIG. 1, an exemplary device structure according to embodiments of the present disclosure is shown, which includes a 3D NAND stacked memory device. The exemplary device structure can be employed to incorporate the embodiments for forming memory stack structures 55 and separator dielectric structures (not shown in FIG. 1) that are illustrated in subsequent drawings. Each memory stack structure 55 can include at least a memory film 50, a semiconductor channel 60, and optionally a dielectric core 62 in case the semiconductor channel 60 does not fill the entire volume within the memory film.

The exemplary device structure includes a substrate 8, which can be a semiconductor substrate. Various semiconductor devices can be formed on, or over, the substrate 8 employing methods known in the art. For example, an array of memory devices can be formed in a device region 100, and at least one peripheral device 20 can be formed in a peripheral device region 200. Electrically conductive via contacts to the electrically conductive electrodes of the devices in the device region 100 can be formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface. In one embodiment, the substrate 8 is a silicon wafer containing a doped well (e.g., p-well) substrate semiconductor layer 10.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well substrate semiconductor layer 10 can be formed within the substrate 8.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. A source region 12 can be formed in a region of the substrate semiconductor layer 10 that is laterally offset from the memory stack structures 55. Alternatively, a source region can be formed directly underneath memory stack structures 55 of memory cells, as described in U.S. patent application Ser. No. 14/317,274, filed on Jun. 27, 2014, which is incorporated herein by reference. A select transistor can be formed between the top of the substrate semiconductor layer 10 and the bottommost control gate of the memory devices.

At least one optional shallow trench isolation structure 16 and/or at least one deep trench isolation structure (not shown) may be employed to provide electrical isolation among various semiconductor devices on the substrate 8. The at least one peripheral device 20 formed in the peripheral device region 200 can include any device known in the art and needed to support the operation of the semiconductor devices in the device region 100. The at least one peripheral device 20 can include a driver circuit associated with the array of the memory devices in the device region 100. The at least one peripheral device can comprise transistor devices in the driver circuit. In one embodiment, the at least one peripheral device can include one or more field effect transistors, each of which can include a source region 201, a drain region 202, a body region 203 (e.g., a channel region), a gate stack 205, and a gate spacer 206. The gate stack 205 can include any type of gate stack known in the art. For example, each gate stack 205 can include, from one side to another, a gate dielectric, a gate electrode, and an optional gate cap dielectric. Optionally, a planarization dielectric layer 170 including a dielectric material may be employed in the peripheral device region 200 to facilitate planarization of the portion of material stacks to be subsequently formed on the substrate 8.

A stack of alternating layers of a first material and a second material different from the first material is formed over a top surface of the substrate 8. In one embodiment, the first material can be an insulator material that forms insulating layers 32, and the second material can be a conductive material that forms conductive line structures that can include electrically conductive layers 46, source-side select gate electrodes (not separately shown), and drain-side select gate electrodes (not separately shown). Alternatively, the first material can be an insulator material that forms insulating layers 32, and the second material can be a sacrificial material that is deposited as sacrificial layers, and is at least partly replaced with a conductive material to form various conductive line structures after formation of memory stack structures 55. In one embodiment, the alternating stack can include insulating layers 32 and material layers, which may comprise a sacrificial material that is subsequently replaced with a conductive material that forms control gate electrodes, or may comprise a conductive material that is patterned into control gate electrodes of a memory device.

The memory stack structures 55 can be formed through the alternating stack (32, 46) of the insulating layers 32 and the electrically conductive layers 46 employing the various methods of the present disclosure to be described below. A drain region 63 can be formed on top of each semiconductor channel 60. A peripheral region dielectric layer 64 can be formed by removing a peripheral portion of the alternating stack of insulating layers 32 and sacrificial material layers 42 from a peripheral device region 200 including the peripheral devices (such as driver circuits) and depositing a dielectric material over the planarization dielectric layer 170. Another portion of the alternating stack (32, 42 or 46) in a contact region 300 can be removed to form stepped surfaces in which the lateral extent of the material layers (such as sacrificial material layers 42 or electrically conductive layers 46) decreases with the vertical distance from the substrate 8. A retro-stepped dielectric fill portion 65 may be optionally employed over the stepped surfaces. As used herein, a retro-stepped structure refers to a structure in which the horizontal vertical cross-sectional area changes stepwise with a vertical distance from a top surface of a substrate such that a vertical cross-sectional area of the structure at a lower horizontal plane is included in vertical cross-sectional areas of the structure at an overlying horizontal plane. Another portion 38 of the dielectric fill may be formed in region 200 at the same time as the portion 65 is formed in region 300.

A contact via trench is formed through the alternating stack (32, 42) at locations of a backside contact via structure 76 to be subsequently formed. If the material layers between vertically neighboring pairs of insulating layers 32 are sacrificial material layers 42, then the sacrificial material layers 42 can be removed by introducing an etchant through the contact via trench. The etchant removes the material of the sacrificial material layers 42 selective to the material of the insulating layers 32 to form interlayer cavities. Electrically conductive layers 46 can be formed by depositing at least one conducive material in the interlayer cavities. The electrically conductive layers 46 include control gate electrodes for the memory stack structures 55. The electrically conductive layers 46 can form terraced (stepped) structures within the contact region 300 in order to facilitate formation of contact via structures 66.

The contact via structures 66 can be formed by forming via cavities that extend to the stepped surfaces of the electrically conductive layers 46, and by filling each via cavity with an optional dielectric liner 64 and a contact via structure 66. The dielectric liner 64, if present, may enhance electrical isolation of the contact via structures 66. A hard mask layer 36 may be optionally employed to facilitate formation of the contact via structures 66. Peripheral contact via structures 86 can be formed in the peripheral device region 200. A backside contact via structure 76 (e.g., source electrode/source local interconnect) can be formed through the alternating stack (32, 46) to provide electrical contact to the source region 12. A dielectric spacer 74 can be employed to provide electrical isolation for the backside contact via structure 76. Subsequently, contacts (not shown) to the drain regions 63 can be formed, and bit lines (not shown) that overlie, and electrically shorted to, the drain regions 63 can be formed.

Referring to FIGS. 2A and 2B, a cut-out portion of a memory region 100 (e.g., memory array region) of an exemplary device structure is illustrated during a processing step employed to form the exemplary structure of FIG. 1 according to an embodiment of the present disclosure. An alternating stack (32, 42) of insulating layers 32 and sacrificial material layers 42 is formed over a substrate 8.

Electrically insulating materials that can be employed for the insulating layers 32 include, but are not limited to undoped silicate glass (silicon oxide without dopants) or doped silicate glasses such as borosilicate glass, phosphosilicate glass, borophosphosilicate glass, fluorosilicate glass, organosilicate glass, and combinations thereof. The sacrificial material layers 42 comprise sacrificial layers, such as silicon nitride or polysilicon sacrificial layers. In an illustrative example, the insulating layers 32 can include silicon oxide (such as undoped silicate glass or doped silicate glass) and the sacrificial material layers 42 can be silicon nitride layers that can be subsequently removed, for example, by a wet etch employing phosphoric acid.

The dielectric material of the insulating layers 32 are herein referred to as a first dielectric material. The first dielectric material that can be etched simultaneously with a second dielectric material to be subsequently employed to form separator dielectric structures, which are dielectric material structures. In one embodiment, the first dielectric material and the second dielectric material can be selected such that the first dielectric material is a first silicon oxide material having a first etch rate in an etching medium, such as buffered hydrofluoric acid, and the second dielectric material is a second silicon oxide material having a second etch rate in the same etching medium, such as buffered hydrofluoric acid, and a ratio of the first etch rate to the second etch rate is in a range from 1.5 to 1,000 Buffered hydrofluoric acid is a mixture of hydrofluoric acid and ammonium fluoride at a volume ratio of 1:7, i.e., 12.5% of HF and 87.5% of $NH_4F$ by volume.

In an illustrative example, the first dielectric material can be selected from borosilicate glass, phosphosilicate glass, borophosphosilicate glass, fluorosilicate glass, organosilicate glass, and combinations thereof, and the second dielectric material can be undoped silicate glass. The doped silicate materials can be deposited by chemical vapor deposition employing a precursor such as tetraethylorthosilicate (TEOS) and at least one dopant source (such as diborane, phosphene, and/or a fluorine-containing dopant gas), and the undoped silicate material can be deposited by chemical vapor deposition employing a precursor such as TEOS without employing any dopant source. Alternatively, spin coating may be employed in lieu of chemical vapor deposition to deposit the undoped silicate glass or doped silicate glass.

Figure 13:
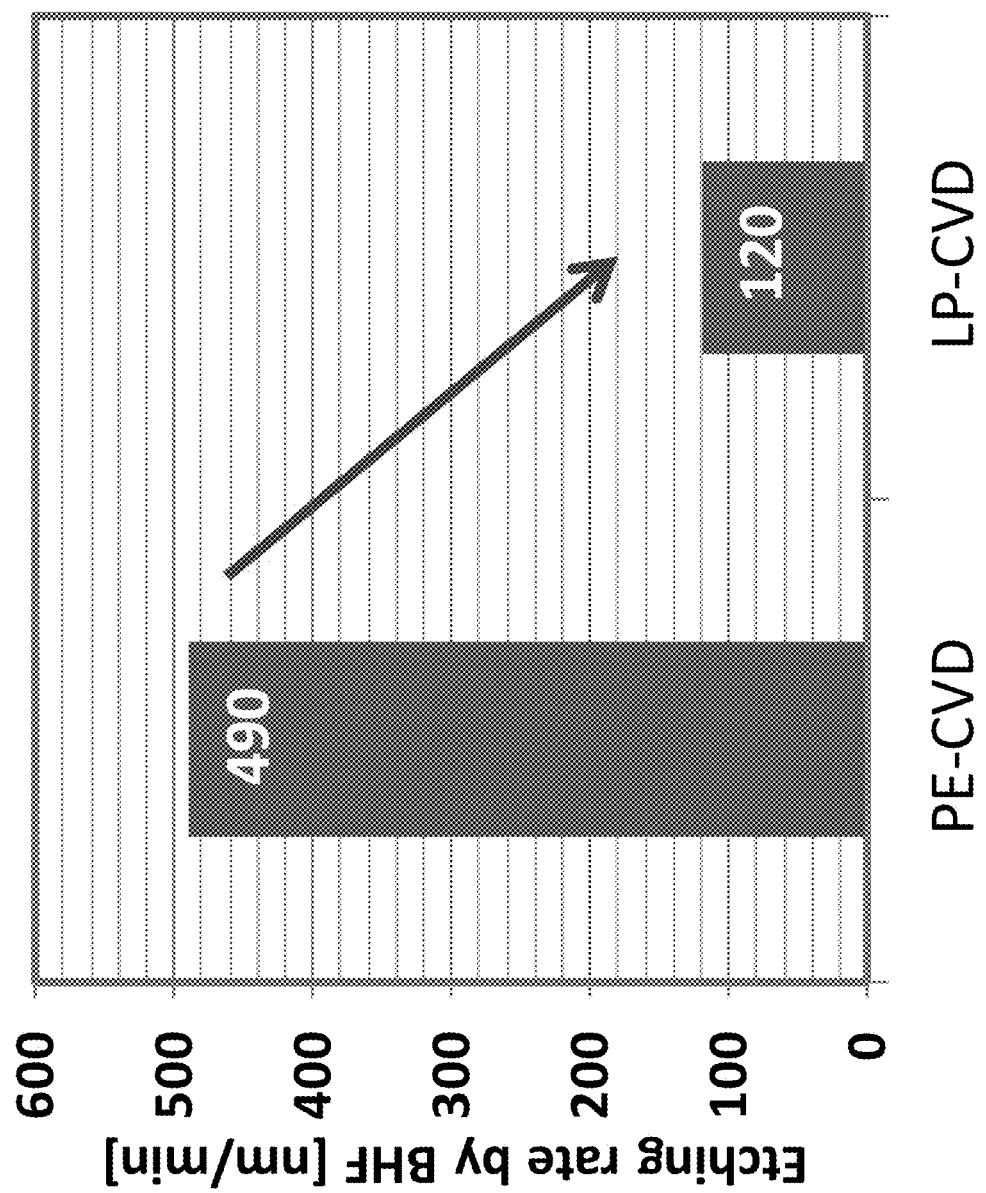
FIG. 13 shows etch rates of silicon oxide materials deposited by different deposition methods in buffered hydrofluoric acid.

In another illustrative example, the etch rate differential between the first dielectric material and the second dielectric material can be provided by a compositional difference in different types of undoped silicate glasses caused by differences in the deposition method. For example, the first dielectric material employed for the insulating layers 32 can be undoped silicate glass (e.g., silicon oxide) deposited by low pressure chemical vapor deposition ("LPCVD"), and the second dielectric material to be subsequently employed can be undoped silicate glass (e.g., silicon oxide) deposited by plasma enhanced chemical vapor deposition ("PECVD"). The undoped silicate glass deposited by LPCVD can be substantially free of hydrogen and carbon, and the undoped silicate glass deposited by PECVD can include at least 0.1% of hydrogen in atomic concentration and/or at least 100 parts per million of carbon in atomic concentration as impurities, thereby enhancing the etch rate in buffered hydrofluoric acid. Comparison of etch rates in buffered hydrofluoric acid between undoped silicate glass formed by PECVD (e.g., about 490 nm/min) and undoped silicate glass formed by LPCVD (e.g., 120 nm/min) is shown in FIG. 13.

Referring to FIGS. 3A and 3B, separator trenches 47 can be formed through the alternating stack (32, 42) of insulating layers 32 and sacrificial material layers 42. The separator trenches 47 can be formed, for example, by application and patterning of a photoresist layer over the alternating stack (32, 42), and transfer of the pattern in the patterned photoresist layer through the alternating stack (32, 42) to the top surface of the substrate 8 that is located at the bottom of the alternating stack (32, 42). The separator trenches 47 laterally extend along a horizontal direction. In one embodiment, the separator trenches 47 can have a substantially uniform width, and can be parallel among one another. The separator trenches 47 can laterally divide the alternating stack (32, 42) into a plurality of portions. The pattern of the separator trenches 47 can be the same as the pattern of the separator dielectric structures to be subsequently formed.

Referring to FIGS. 4A and 4B, each separator trench 47 can be filled with the second dielectric material discussed above. The second dielectric material is also referred to as a separator insulating material. As discussed above the second dielectric material has a lower etch rate in buffered hydrofluoric acid than the first dielectric material of the insulating layers 32. For example, the separator insulating material can be undoped silicate glass (e.g., LPCVD silicon oxide). Excess portions of the separator insulating material can be removed from above the top surface of the alternating stack, for example, by chemical mechanical planarization (CMP), a recess etch, or a combination thereof. Remaining portions of the deposited separator insulating material constitutes separator dielectric structures 45. In one embodiment, the separator dielectric structures 45 can laterally separate various portions of the alternating stack (32, 42).

Each separator dielectric structure 45 can extend through the alternating stack (32, 42), i.e., from the top surface of the substrate 8 to the top surface of the alternating stack (32, 42). Thus, the alternating stack (32, 42) as formed at the processing steps of FIGS. 2A and 2B is divided into multiple laterally disjoined portions by the separator dielectric structures 45, each of which comprises discrete portions of the alternating stack (32, 42).

Referring to FIGS. 5A and 5B, memory openings 49 can be formed through the alternating stack (32, 42), for example, by application of a masking layer over the alternating stack (32, 42), patterning of the masking layer, and transfer of the pattern in the masking layer through the alternating stack (32, 42) by an anisotropic etch such as a reactive ion etch. The masking layer can include a photoresist layer and optionally include an additional hard mask material layer such as a carbon layer. The masking layer can be subsequently removed, for example, by ashing. Each memory opening 49 can vertically extend from the top surface of the alternating stack (32, 42) to the top surface of the substrate that is located at the bottom of the alternating stack (32, 42). Each memory opening 49 can be located between a pair of separator dielectric structures 45, which are remaining portions of the separator dielectric structures as formed at the step of FIGS. 3A and 3B.

In one embodiment, each memory opening 49 can divide a separator dielectric structure 45 into two physically disjoined portions. In this case, each memory opening 49 in the alternating stack (32, 42) can extend through the separator insulating material located in a respective separator dielectric structures 45, and can divide the separator dielectric structure 45 into two laterally disjoined portions.

Each separator dielectric structure 45 can extend along the first lateral direction ld1 prior to formation of the memory openings 49, and can be divided into a plurality of separator dielectric structures 45 by formation of the memory openings 49 through portions of the separator dielectric structure 45. Each plurality of separator dielectric structures 45 derived from the same separator dielectric structure 45 as provided at the processing steps of FIGS. 4A and 4B can be arranged along the first lateral direction ld1, and can be laterally spaced apart by the memory openings 49 through the alternating stack (32, 42). Each plurality of separator dielectric structures 45 derived from the same separator dielectric structure 45 as provided at the processing steps of FIGS. 4A and 4B can have vertical sidewalls that are located within a pair of vertical planes, which are the vertical planes containing the sidewalls of the respective separator dielectric structure 45 at the processing steps of FIGS. 4A and 4B that extend along the first lateral direction ld1. Each of the plurality of separator dielectric structures 45 and the memory openings 49 can vertically extend from the bottommost layer of the alternating stack (32, 42) to a topmost layer of the alternating stack (32, 42). A top surface of the substrate semiconductor layer 10 can be physically exposed at the bottom of each memory opening 49.

Referring to FIGS. 6A-6C, sidewalls of the insulating layers 32 are laterally recessed by an isotropic etch process. Physically exposed portions of the separator dielectric structures 45 can be collaterally etched by the isotropic etch process. The isotropic etch process can be a wet etch process employing hydrofluoric acid, diluted hydrofluoric acid, buffered hydrofluoric acid, or a variation thereof that includes at least another acid or a diluents (such as deionized water). Alternatively, the isotropic etch process can be a vapor phase etch process employing HF vapor. Alternatively, a different etch chemistry can be employed which etches the first dielectric material of the insulating layers 32 at a greater etch rate than the second dielectric material of the separator dielectric structures 45 around the memory openings 49.

In one embodiment, the first dielectric material of the insulating layers 32 can be a first silicon oxide material that is removed at a first etch rate during the isotropic etch processes, and the second dielectric material of the separator dielectric structures 45 can be a second silicon oxide material that is removed at a second etch rate during the isotropic etch process. The ratio of the first etch rate to the second etch rate can be in a range from 1.5 to 1,000, such as from 2 to 5. In one embodiment, the lateral recess distance of the sidewalls of the insulating layers 32 can be in a range from 4 nm to 30 nm, such as from 5 nm to 20 nm, although lesser and greater lateral recesses distances can also be employed.

In one embodiment, the physically exposed sidewalls of the separator dielectric structure 45 can develop a convex profile that is invariant along a vertical direction during the isotropic etch process. In other words, the physically exposed sidewalls of the separator dielectric surfaces 45 can have a convex horizontal cross-sectional shape that does not change with translation along the vertical direction.

Referring to FIGS. 7A-7C, an etchant that etches the sacrificial material layers 42 can be introduced through the memory openings 49 to remove the sacrificial material layers 42. The etchant is selected such that the sacrificial material layers 42 are removed selective to the insulating layers 32 and the substrate 8. For example, if the insulating layers 32 comprise silicon oxide and the sacrificial material layers 42 comprise silicon nitride, a wet etch employing hot phosphoric acid can be employed to remove the sacrificial material layers 42 selective to the insulating layers 32. Thus, the sacrificial material layers 42 are etched selectively with respect to the insulating layers 32 from inside each memory opening 49. In one embodiment, the sacrificial material layers 42 can be completely removed from the device region 100. Thus, the memory openings 49 are selectively laterally expanded at each level where layers 42 were previously located.

An interlayer cavity (i.e., recess) 43 is formed at each level of the sacrificial material layers 42, and is connected to multiple memory openings 49. The separator dielectric structures 45 can provide structural support to the insulating layers 32 after formation of the interlayer cavities 43. Each interlayer cavity 43 may be located between a vertically neighboring pair of insulating layers 32. A planar bottom surface of an overlying insulating layer 32 and a planar top surface of an underlying insulating layer 32 can be physically exposed to each interlayer cavity 43.

Referring to FIGS. 8A-8C, at least one electrically conductive material, such as at least one metallic material, can be deposited in the plurality of interlayer cavities 43, on the sidewalls of the insulating layers 32 around each memory opening 49, and over the top surface of the alternating stack. As used herein, a metallic material refers to an electrically conductive material that includes at least one metallic element. The at least one electrically conductive material can be deposited in spaces (i.e., in cavities 43) between vertically neighboring pairs of the insulating layers 32.

The electrically conductive material can be deposited by a conformal deposition method, which can be, for example, chemical vapor deposition (CVD), atomic layer deposition (ALD), electroless plating, electroplating, or a combination thereof. The electrically conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of interlayer cavities 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of interlayer cavities 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A continuous conductive material portion 46L can be formed as a single continuous structure in the plurality of interlayer cavities 43, on the sidewalls of the insulating layers 32, and over the top surface of the alternating stack. Thus, each sacrificial material layer can be replaced a respective portion of the continuous conductive material portion 46L, which constitutes a respective electrically conductive layer. A cavity 49' surrounded by the deposited electrically conductive material is present in each memory opening 49 after deposition of the electrically conductive material.

Referring to FIGS. 9A-9C, portions of the electrically conductive material of the continuous conductive material portion 46L can be removed from the memory openings 49 by an etch process, which can be an isotropic etch process or an anisotropic etch process. In case an isotropic etch process is employed, removal of the electrically conductive material can be times such that the sidewalls of the insulating layers 32 are physically exposed within each memory opening 49 by the isotropic etch process. Further, the isotropic etch process can be terminated upon physical exposure of the sidewalls of the insulating layers 32 at the periphery of each memory opening 49 so that an electrically conductive layer 46 can be present between each vertically neighboring pair of insulating layers 32. In case an anisotropic etch process is employed, the insulating material layers 32 can function as an etch mask, and the entirety of the deposited electrically conductive material within the memory openings 49 can be removed by the anisotropic etch. The anisotropic etch can be selective to the semiconductor material of the substrate 8.

The sidewalls of the eclectically conductive layers 46 (which are the remaining portions of the deposited conductive material) can be within the same vertical plane as sidewalls of overlying and/or underlying insulating layers 32, or can be laterally recessed away from a respective memory opening 49 with respect to sidewalls of the memory opening (which are the sidewalls of the insulating layers 32). Memory openings 49 extending through the alternating stack (32, 42) and having at least the volume of a corresponding memory opening 49 at the processing steps of FIGS. 6A-6C can be provided by removal of the electrically conductive material.

Referring to FIGS. 10A-10C, a memory stack structure 55 (i.e., structure having layers (52, 54, 56, 60)) including a memory film 50 (i.e., film having layers (52, 54, 56)) and a vertical semiconductor channel 60 can be formed in each of the memory openings 49. Each memory film (52, 54, 56) can include, from outside to inside, a blocking dielectric layer 52, charge storage regions 54, and a tunneling dielectric 46.

The blocking dielectric layer 52 includes at least one dielectric material such as a dielectric metal oxide and/or a dielectric semiconductor oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. In one embodiment, the blocking dielectric layer 52 can include aluminum oxide, silicon oxide, or a stack thereof. The thickness of the blocking dielectric layer 52 can be in a range from 2 nm to 10 nm, although lesser and greater thicknesses can also be employed.

The charge storage regions 54 can be a continuous vertically extending layer including a charge trapping material. The charge trapping material may be a dielectric charge trapping material, which can be, for example, silicon nitride. Alternatively, the charge storage regions 54 can include a conductive material such as doped polysilicon or a metallic material that is patterned into multiple electrically isolated portions (e.g., floating gates), for example, by being formed within lateral recesses into sacrificial material layers 42. In one embodiment, the charge storage regions 54 can be embodies as a single charge storage material layer (such as a silicon nitride layer) that extends from the bottommost layer of the alternating stack (32, 46) to a topmost layer of the alternating stack (32, 46).

The tunneling dielectric 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric 56 can include a stack of a first silicon oxide layer, a silicon oxynitride layer, and a second silicon oxide layer, which is commonly known as an ONO stack. In one embodiment, the tunneling dielectric 56 can include a silicon oxide layer that is substantially free of carbon or a silicon oxynitride layer that is substantially free of carbon. The thickness of the tunneling dielectric 56 can be in a range from 2 nm to 20 nm, although lesser and greater thicknesses can also be employed. A set of a tunneling dielectric 56, charge storage regions 54, and a blocking dielectric 52 in a same memory opening 49 collectively constitutes a memory film (52, 54, 56).

The vertical semiconductor channel 60 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the vertical semiconductor channel 60 includes amorphous silicon or polysilicon. The vertical semiconductor channel 60 can be formed by a conformal deposition method such as low pressure chemical vapor deposition (LPCVD). The thickness of the vertical semiconductor channel 60 can be in a range from 2 nm to 10 nm, although lesser and greater thicknesses can also be employed. In one embodiment, the vertical semiconductor channel 60 can be formed by deposition of an outer semiconductor channel layer, an anisotropic etch that removes horizontal portions of the outer semiconductor channel layer and the memory film (56, 54, 52) and physically exposes a top surface of the substrate semiconductor layer 10 underneath each memory opening 49, and deposition of an inner semiconductor channel layer on each physically exposed top surface of the substrate semiconductor layer 10 and inner sidewalls of the outer semiconductor channel layer. Each adjoining set of an outer semiconductor channel layer and an inner semiconductor channel layer inside a memory opening 49 constitutes a vertical semiconductor channel 60. A cavity may be present in a volume of each memory opening 49 that is not filled with the deposited material layers (52, 54, 56, 60).

In case each memory opening 49 is not completely filled by the vertical semiconductor channel 60, a dielectric material can be deposited to fill any remaining cavity within each memory opening 49. The dielectric material can include silicon oxide or organosilicate glass, and can be deposited by a conformal deposition method such as low pressure chemical vapor deposition (LPCVD), or by a self-planarizing deposition process such as spin coating. Excess portions of the dielectric material can be removed from above the top surface of the alternating stack (32, 46). Each remaining portion of the dielectric material constitutes a dielectric core 62.

Referring to FIGS. 11A-11C, the dielectric cores 62 can be vertically recessed by an etch process, which can be an isotropic etch process or an anisotropic etch process. The recesses can be filled with a doped semiconductor material having a doping of the first conductivity type. The deposited doped semiconductor material can include, for example, doped polysilicon, which may be doped by at least one of in-situ doping and ion implantation doping or a combination thereof. Excess portions of the deposited semiconductor material can be removed from above the top surface of the alternating stack (32, 46), for example, by chemical mechanical planarization (CMP) or a recess etch to form the drain regions 63.

Figure 12:
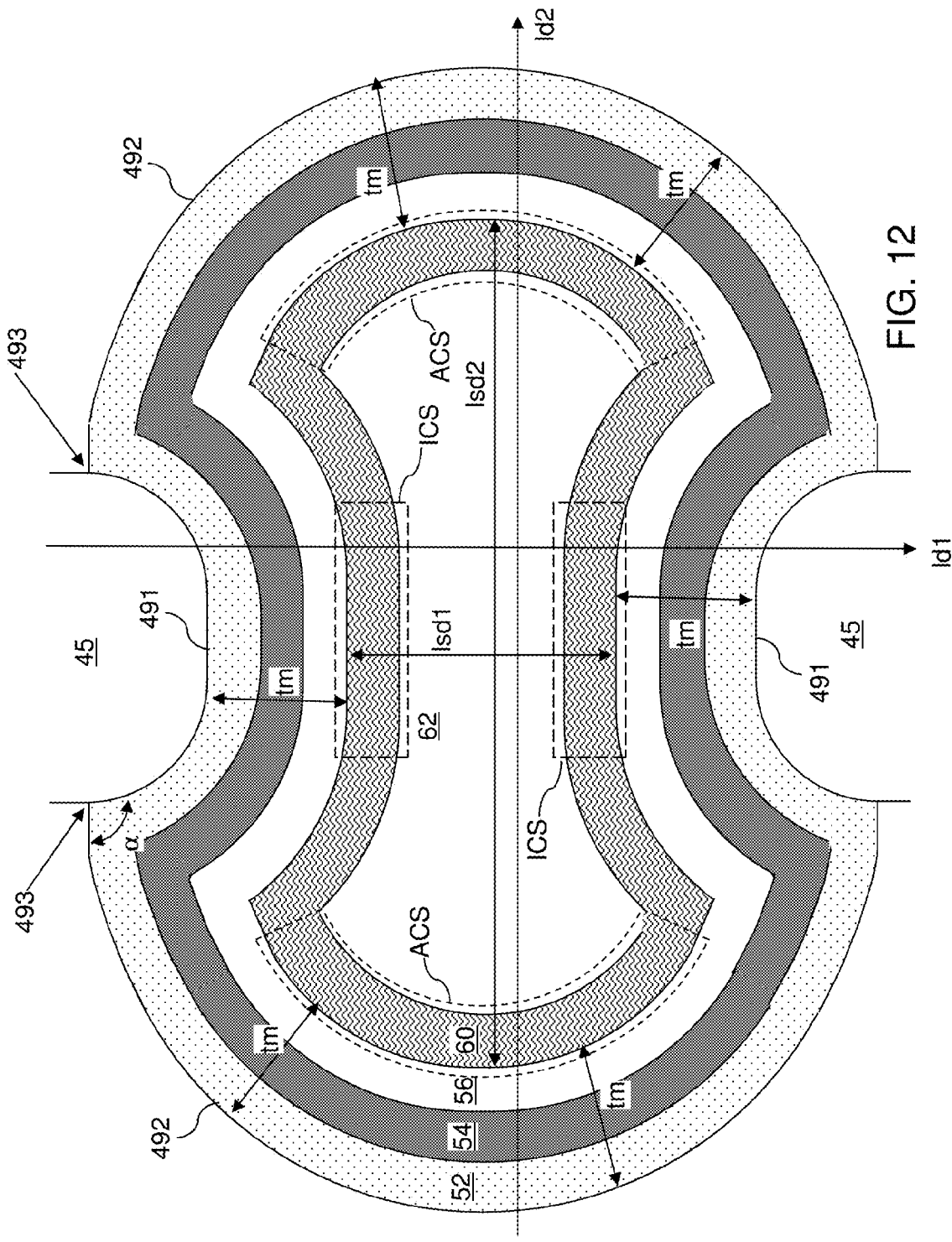
FIG. 12 is a magnified horizontal cross-sectional view of a memory stack structure and a pair of separator dielectric structures in the exemplary structure according to an embodiment of the present disclosure.

Geometrical features of a memory stack structure (52, 54, 56, 60), a dielectric core 62, and separator dielectric structures 45 laterally contacting the memory stack structure (52, 54, 56, 60) are illustrated in FIG. 12.

The pair of separator dielectric structures 45 illustrated in FIG. 12 extends through the alternating stack (32, 46), i.e., vertically extends from a bottommost layer of the alternating stack (32, 46) to a topmost layer of the alternating stack (32, 46). Further, the pair of separator dielectric structures 45 laterally extends along a first lateral direction ld1. The memory stack structure (52, 54, 56, 60) includes a memory film (52, 54, 56) and a vertical semiconductor channel 60, and extends through the alternating stack (32, 46). The memory stack structure (52, 54, 56, 60) has a pair of first sidewalls 491 that contact sidewalls of the pair of separator dielectric structures 45, and has a pair of second sidewalls 492 that protrude outward along a second lateral direction ld2. The first sidewalls 491 are laterally recessed inward from substantially vertical edges 493 of the pair of second sidewalls 492. In one embodiment, the first sidewalls 491 can have concave surfaces that extend vertically, and the second sidewalls 492 can have convex surfaces that extend vertically.

A dielectric core 62 can be present within the vertical semiconductor channel 60, and can have a pair of concave sidewalls that face a respective separator dielectric structure 45 and a pair of convex sidewalls adjoined to the pair of concave sidewalls. The concave sidewalls and the convex sidewalls of the dielectric core 62 contacts inner sidewalls of the vertical semiconductor channel 60. In one embodiment, the vertical edges 493 of the second sidewalls of the memory stack structure (52, 54, 56, 60) adjoins a respective sidewall of the pair of separator dielectric structures 45 at an angle α in a range from 45 degrees to 135 degrees. In one embodiment, the angle between the first lateral direction ld1 and the second lateral direction ld2 can be in a range from 60 degrees to 120 degrees. For example, the angle between the first lateral direction ld1 and the second lateral direction ld2 can be about 90 degrees.

In one embodiment, the vertical semiconductor channel 60 can include a pair of convex outer sidewalls that are separated from a respective second sidewall 492 of the memory stack structure (52, 54, 56, 60) by the thickness tm of the memory film (52, 54, 56), and a pair of concave outer sidewalls that are separated from a respective first sidewall 491 of the memory stack structure (52, 54, 56, 60) by the thickness tm of the memory film (52, 54, 56).

In one embodiment, a lateral separation distance lsd2 between the pair of convex outer sidewalls of the vertical semiconductor channel 60 is greater than a lateral separation distance lsd1 between the pair of concave outer sidewalls of the vertical semiconductor channel 60. The memory film (52, 54, 56) can include a tunneling dielectric 56 contacting, and laterally surrounding, the vertical semiconductor channel 60, and charge storage regions embodied as portions of a charge trapping layer 54 that are located at levels of the electrically conductive layers 46. The charge trapping layer is a continuous layer that extends through the alternating stack (32, 46) and laterally surrounds the tunneling dielectric 60. The memory film (52, 54, 56) can further comprise a blocking dielectric 52 laterally surrounding the charge trapping layer and having the pair of first sidewalls 491 and the pair of second sidewalls 492 of the memory stack structure (52, 54, 56).

The memory device of the present disclosure can comprise a vertical NAND device located over the substrate 8. The electrically conductive layers 46 can comprise, or can be electrically connected to, a respective word line of the NAND device. The substrate 8 can comprise a silicon substrate. The vertical NAND device can comprise an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels such that at least one end portion (i.e., a vertical semiconductor channel 60) of each of the plurality of semiconductor channels extends substantially perpendicular to a top surface of the substrate 8. The array of monolithic three-dimensional NAND strings can comprise a plurality of charge storage elements. Each charge storage element can be located adjacent to a respective one of the plurality of semiconductor channels. The array of monolithic three-dimensional NAND strings can comprise a plurality of control gate electrodes (as embodied as the electrically conductive layers 46) having a strip shape extending substantially parallel to the top surface of the substrate 8. The plurality of control gate electrodes can comprise at least a first control gate electrode located in the first device level and a second control gate electrode located in the second device level.

The vertical semiconductor channel 60 includes a pair of active channel section ACS adjacent to the second sidewalls 492 of the memory stack structure (52, 54, 56, 60), and a pair of inactive channel sections ICS adjacent to the first sidewalls 491 of the memory stack structure (52, 54, 56, 60).

Figure 14:
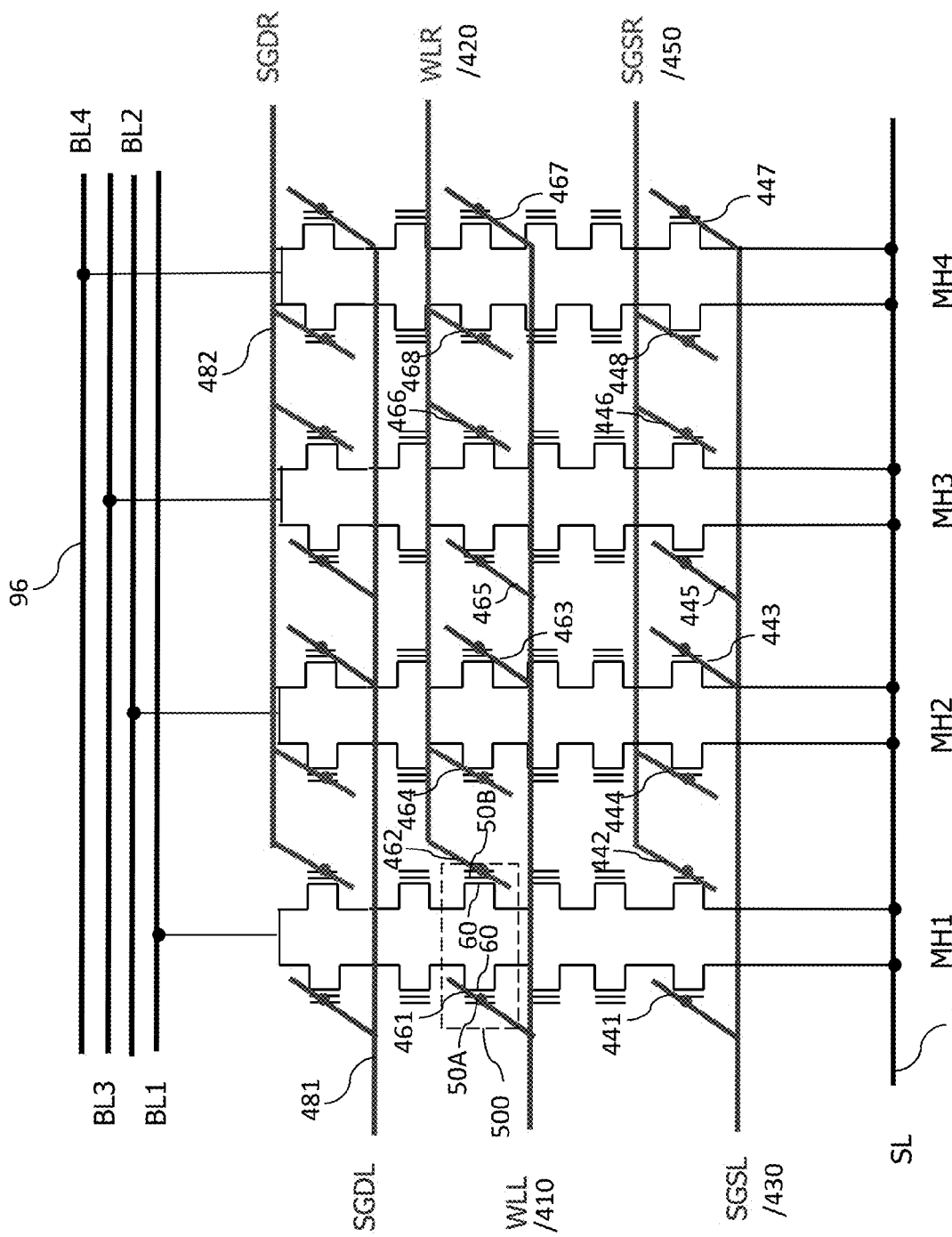
FIG. 14 is a circuit schematic for the array region of the first exemplary device structure.

FIG. 14 is a circuit schematic of the array region of any of the exemplary device structure of the present disclosure. The circuit schematic represents a plurality of NAND strings. Each NAND string comprises a plurality of memory cells.

Referring to FIGS. 1, 11A-11C, 12, and 14 collectively, the NAND memory device can comprise a substrate 8 having a major surface 9. The first plurality of memory cells are arranged in the first NAND string extending in a first direction substantially perpendicular to the major surface 9 of the substrate 8 in a plurality of device levels. Each of the first plurality of memory cells is positioned in a respective one of the plurality of device levels above the substrate 8.

Each memory cell in the NAND string comprises a portion of a first control gate electrode 461 (which is a first portion of an electrically conductive layer 46) located adjacent to a first portion 50A (which is located on one side of a respective pair of separator dielectric structures 45) of a memory film (52, 54, 56) and a portion of a second control gate electrode 462 which is located adjacent to a second portion 50B (which is located on the other side of the respective pair of separator dielectric structures 45) of the memory film (52, 54, 56). The second control gate electrode 462 is electrically insulated from the first control gate electrode 461.

The first control gate electrode 461 extends in a second direction substantially parallel to the major surface 9, and the second control gate electrode 462 extends in the second direction and spaced apart from the respective first control gate electrode 461 in a third direction substantially parallel to the major surface 9 and transverse to the second direction. Each memory cell can comprise a first portion 50A of a memory film (52, 54, 56) which is located between the first control gate electrode 461 and a first portion of a semiconductor channel 60, and a second portion 50B of the memory film (52, 54, 56) which is located between the first control gate electrode 462 and a second portion of the semiconductor channel 60.

Thus, each memory cell of this embodiment includes a unitary portion (i.e., electrically continuous, single portion) of the vertical semiconductor channel 60, the first memory film portion 50A, the second memory film portion 50B, at least a portion of a first control gate electrode 461 located adjacent to the first memory film portion 50A, and at least a portion of a first control gate electrode 462 located adjacent to the second memory film portion 50B. The first control gate electrode 462 is electrically isolated from the first control gate electrode 461 and the first memory film. In other words, the memory cell of this embodiment includes a common channel and memory film and separate control gate electrodes in the same horizontal device level.

Each level of control gate electrodes can include a first word line and a second word line. The first word line can comprise a comb shaped word line WLL/410 having a terrace contact portion (shown in FIG. 1) located in the first stepped contact region (300) and a plurality of prongs (461, 463, 465, 467) extending from a terrace contact portion into the device region. The second word line can comprise a comb shaped word line WLR/420 having a terrace contact portion (not shown) located in the second stepped contact region (not shown) and a plurality of prongs (462, 464, 466, 468) extending from the terrace contact portion into the device region.

Figure 15:
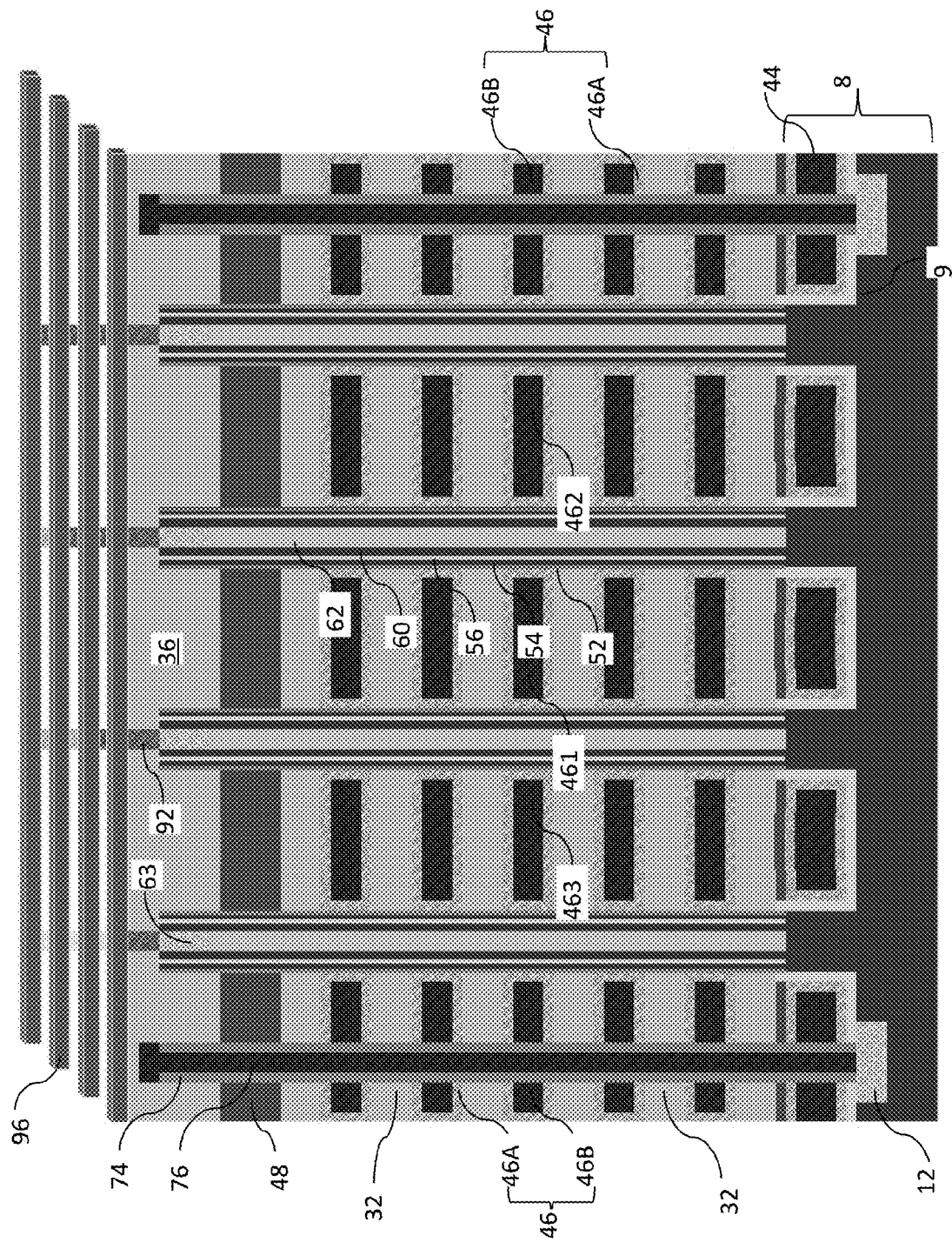
FIG. 15 is a vertical cross-sectional view of the second exemplary device structure after formation of bit lines according to the second embodiment of the present disclosure.
Figure 17:
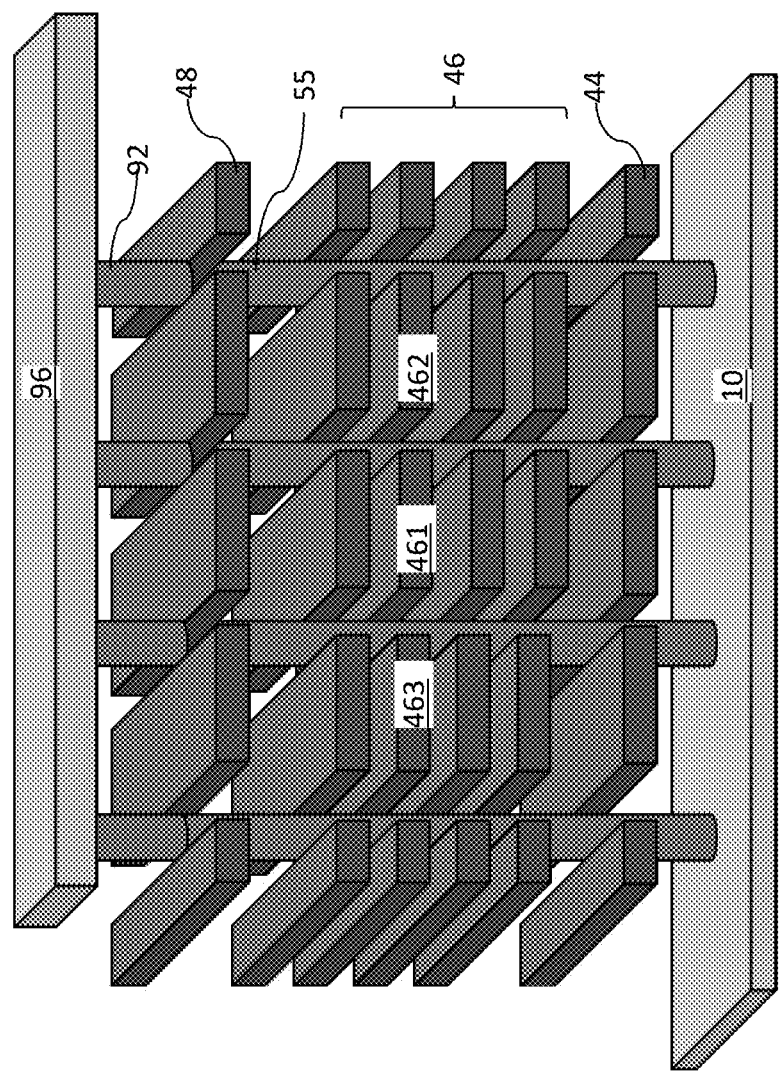
FIG. 17 is a perspective view of an array region of the exemplary device structure according to an embodiment of the present disclosure.

At least one pair of lower select gate electrodes {(SGSL/430), (SGSR, 450)}, e.g., source select gate electrodes as embodied as at least one bottommost electrically conductive layers 44 as shown in FIGS. 15 and 17, can be located between the major surface 9 of the substrate 8 and the plurality of memory cells. Such lower select gate electrodes {(SGSL/430), (SGSR, 450)} can include a first lower select gate electrode (SGSL/430) and a second lower select gate electrode (SGSR, 450)}. The first lower select gate electrode (SGSL/430) can be connected to a first subset of source select gate electrodes (441, 443, 445, 447) located on one side of each memory stack structure (52, 54, 56, 60), and the second lower select gate electrode (SGSR/450) can be connected to a second subset of source select gate electrodes (442, 444, 446, 448) located on another side of each memory stack structure (52, 54, 56, 60).

At least one pair of upper select gate electrodes (SGDL, SGDR), e.g., drain select gate electrodes 48 as shown in FIGS. 15 and 17 as embodied as at least one topmost electrically conductive layers 46, can be located above the plurality of memory cells in a top portion of the alternating stack (32, 46). Such upper select gate electrodes (SGDL, SGDR) can include a first upper select gate electrode SGDL and a second upper select gate electrode (SGDR. The first upper select gate electrode SGDL can be connected to a first subset of drain select gate electrodes located on one side of each memory stack structure (52, 54, 56, 60), and the second upper select gate electrode SGDR can be connected to a second subset of source select gate electrodes located on another side of each memory stack structure (52, 54, 56, 60).

Each lower end of the semiconductor channels can be electrically connected to a source line SL, which can be embodied as a backside contact via structure 76. Each upper end of the semiconductor channels can be connected to a respective bit line 96 (e.g., BL1, BL2, BL3, BL4) through a respective drain region 63 and local interconnects (i.e., electrodes) 92, as shown in FIGS. 15 and 17.

In a non-limiting illustrative example, a read operation of on a memory cell in a memory opening 49 (e.g., MH1, MH2, MH3, MH4) can be performed by applying a voltage of about 5-7 V to a selected upper select gate electrode (e.g., SGDL/481), a voltage of about 0 V to an unselected upper select gate electrode (e.g., SGDR/482), a selected-line read voltage of about 3-5 V to a selected word line (e.g., WLL/410) connected to the selected control gate electrode (e.g., a first control gate electrode 461), and an unselected-line read voltage of about 7-8 V to unselected word lines connected to unselected control gate electrodes, negative 3-5V to second control gate electrode 462 in same level/cell as selected control gate electrode. A voltage of about 5-7 V can be applied to the selected lower select gate electrode (e.g., SGSL/430), and a voltage of about 0 V can be applied to the unselected lower select gate electrode (e.g., SGSR/450) connected to the same memory stack structure (52, 54, 56, 60) (See FIG. 1). A voltage of about 1-2 V can be applied to the selected bit line (e.g., BL1), and a voltage of about 0 V can be applied to the unselected bit lines (e.g., BL2, BL3, BL4). The source line SL/76, which can be embodied as a backside contact via structure 76, can be biased at about 0-1 V. The various voltages can be scaled and/or adjusted as needed.

In a non-limiting illustrative example, a programming operation of on a memory cell can be performed by applying a voltage of about 2-3 V to a selected upper select gate electrode (e.g., SGDL/481), a voltage of about 0 V to an selected upper select gate electrode (e.g., SGDR/482), a selected-line programming voltage of about 18-20 V to a selected word line (e.g., WLL/410) connected to the selected control gate electrode (e.g., a first control gate electrode 461), and an unselected programming voltage of about 7-9 V to unselected word lines (e.g., WLR/420) connected to unselected control gate electrodes. A voltage of about 0 V can be applied to the selected lower select gate electrode (e.g., SGSL/430), and a voltage of about 0 V can be applied to unselected lower select gate electrodes SGSR/450. A voltage of about 0 V can be applied to the selected bit line (e.g., BL1), and a voltage of about 2-3 V can be applied to the unselected bit lines (e.g., BL2, BL3, BL4). The source line SL can be biased at about 1-3 V. During the erase operation, the selected upper and lower select gate electrodes may be biased to 10-12 V, the selected bit line and source line may be biased to 18-20V and the rest of the lines and electrodes are unbiased (e.g., about 0V).

Figure 16:
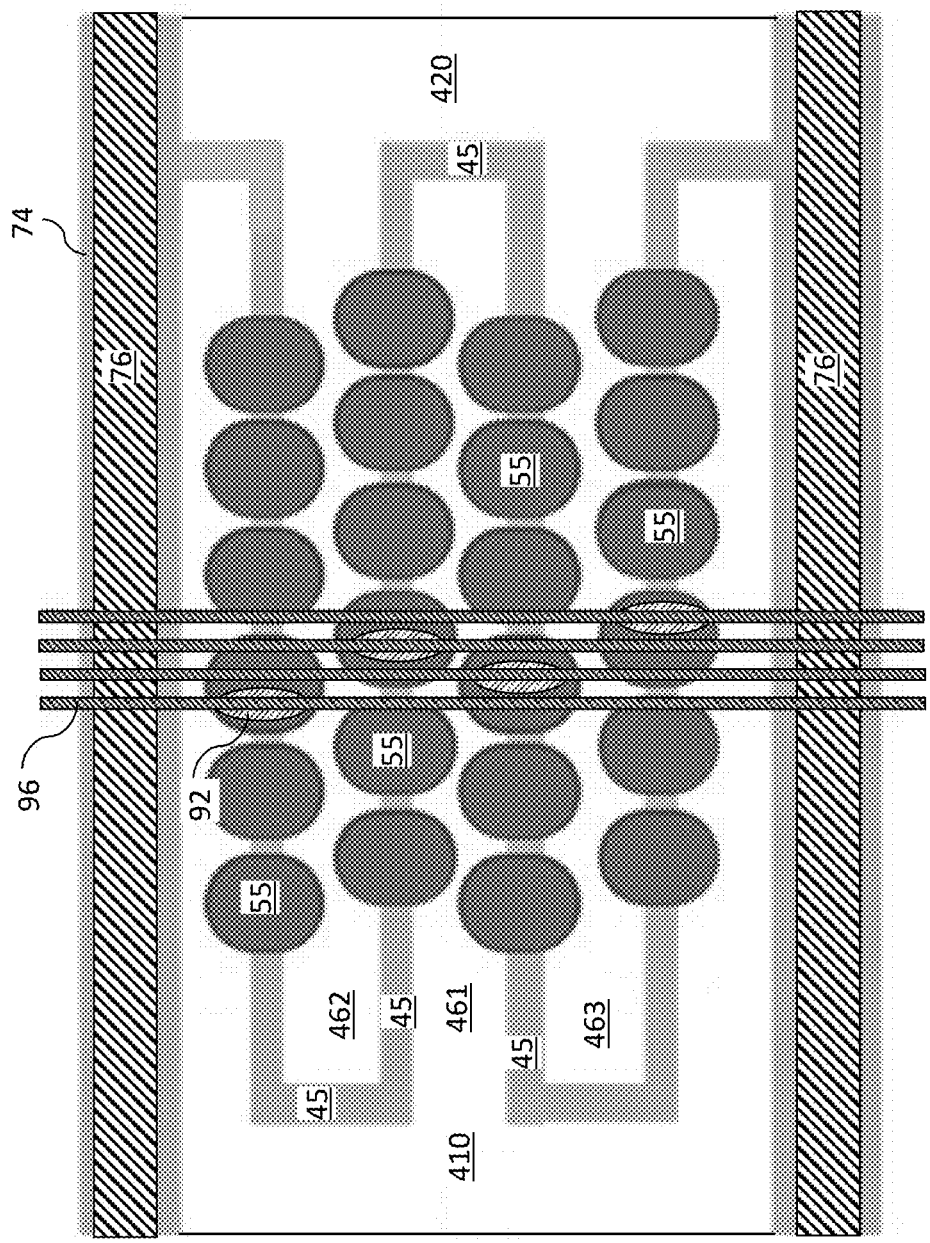
FIG. 16 is a see-through top-down view of the exemplary device structure that illustrates global shapes of various components of the exemplary device structure according to an embodiment of the present disclosure.

Referring to FIGS. 15-17, the exemplary structure can include a memory device, which comprises a stack of alternating layers comprising insulating layers 32 and electrically conductive layers 46 located over a substrate 8, a memory stack structure (52, 54, 56, 60) located within a memory opening extending through the stack, and including semiconductor channel 60 having a vertical portion that extends along a direction perpendicular to a top surface of the substrate 8. The memory stack structure (52, 54, 56, 60)

comprises multiple sets of at least two charge storage elements located around the semiconductor channel 60 at each level of the electrically conductive layers 46 (e.g., layers 46A in a first level and layers 46B in a second level located below the second level). Each set of at least two charge storage elements comprises charge storage elements that are located at the same level as a respective electrically conductive layer 46, and are electrically isolated from one another, from the semiconductor channel 60 by at least one respective tunneling dielectric 56, and from respective control gate electrodes (which are adjacent portions of the electrically conductive layers 46) thereof by at least one respective blocking dielectric 52.

The separator dielectric structures 45 extend through the stack, contact portions of outer sidewalls of the memory stack structures 55, and laterally separate the control gate electrodes 46 of the plurality of charge storage elements (which are portions of the charge storage regions 54). The patterned electrically conductive layers 46 comprise control gate electrodes of the multiple sets of at least two charge storage elements 54. Each set of at least two charge storage elements comprises two regions located within a continuous portion of a charge trapping layer located at the same level.

Separator dielectric structures 45 can extend through the stack, contact sidewalls of the memory stack structure (52, 54, 56, 60), and laterally separate the control gate electrodes of the plurality of charge storage elements. In one embodiment, the at least one blocking dielectric can be a single contiguous blocking dielectric layer 52 contacting each of the electrically conductive layers 46 and each set of at least two charge storage elements. The at least one respective tunneling dielectric is a single contiguous tunneling dielectric 56 that vertically extends through the stack and laterally surrounds the semiconductor channel 60.

The exemplary structure can include a memory device, which comprises an alternating stack of insulating layers 32 and patterned electrically conductive layers 46 located over a substrate 8. Each memory stack structure (52, 54, 56, 60) comprises a plurality of memory cells arranged in a string extending in a first direction substantially perpendicular to the major surface 9 of the substrate 8 in a plurality of device levels. Each of the plurality of memory cells is positioned in a respective one of the plurality of device levels above the substrate 8. A semiconductor channel 60 extends through all levels within the plurality of device levels in each memory stack structure (52, 54, 56, 60).

The embodiments of the present disclosure provide better threshold voltage distribution for the vertical field effect transistors including the vertical semiconductor channels 60 by reducing read disturb and improving data retention. By providing a concave shape for the inactive channel sections ICS, the inactive channel sections ICS are subjected to weaker fringe field because the inactive channel sections ICS are located farther away from word lines (control gate electrodes) than a reference structure in which the inactive channel sections are not recessed. Thus, the inactive channel sections ICS receive less disturbance in leakage current modulation during application of a Vpass voltage. Thus, the configuration of the present disclosure can provide superior transistor performance for multi-cell per level memory stack structures.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
an alternating stack of insulating layers and electrically conductive layers located over a substrate;
a pair of separator dielectric structures extending through the alternating stack and laterally extending along a first lateral direction;
a memory stack structure including a memory film and a vertical semiconductor channel extending through the alternating stack, having a pair of first sidewalls that contact sidewalls of the pair of separator dielectric structures, and having a pair of second sidewalls that protrude outward along a second lateral direction, wherein the first sidewalls are laterally recessed inward from substantially vertical edges of the pair of second sidewalls; and
a dielectric core having a pair of concave sidewalls that face a respective separator dielectric structure and a pair of convex sidewalls adjoined to the pair of concave sidewalls.

2. The memory device of claim 1, wherein:
the first sidewalls have concave surfaces that extend vertically; and
the second sidewalls have convex surfaces that extend vertically.

3. The memory device of claim 1, wherein the pair of separator dielectric structures vertically extend from a bottommost layer of the alternating stack to a topmost layer of the alternating stack.

4. The memory device of claim 1, wherein the vertical edges of the second sidewalls of the memory stack structure adjoin a respective sidewall of the pair of separator dielectric structures at an angle in a range from 45 degrees to 135 degrees.

5. The memory device of claim 1, wherein an angle between the first lateral direction and the second lateral direction is in a range from 60 degrees to 120 degrees.

6. The memory device of claim 1, wherein the vertical semiconductor channel comprises:
a pair of convex outer sidewalls that are separated from a respective second sidewall of the memory stack structure by a thickness of the memory film; and
a pair of concave outer sidewalls that are separated from a respective first sidewall of the memory stack structure by the thickness of the memory film.

7. The memory device of claim 6, wherein a lateral separation distance between the pair of convex outer sidewalls is greater than a lateral separation distance between the pair of concave outer sidewalls.

8. The memory device of claim 1, wherein
the insulating layers comprise a first silicon oxide material having a first etch rate in buffered hydrofluoric acid;
the pair of separator dielectric structures comprises a second silicon oxide material having a second etch rate in buffered hydrofluoric acid; and
a ratio of the first etch rate to the second etch rate is in a range from 2 to 5.

9. The memory device of claim 1, wherein:
the insulating layers comprise a material selected from borosilicate glass, phosphosilicate glass, borophosphosilicate glass, fluorosilicate glass, organosilicate glass, and combinations thereof; and
the pair of separator dielectric structures comprise undoped silicate glass.

10. The memory device of claim 1, wherein the memory film comprises:
a tunneling dielectric contacting, and laterally surrounding, the vertical semiconductor channel; and
a charge trapping layer that laterally surrounds the tunneling dielectric.

11. The memory device of claim 10, wherein the memory film further comprises a blocking dielectric laterally surrounding the charge trapping layer and having the pair of first sidewalls and the pair of second sidewalls of the memory stack structure.

12. The memory device of claim 1, wherein:
the memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

13. A memory device, comprising:
an alternating stack of insulating layers and electrically conductive layers located over a substrate;
a pair of separator dielectric structures extending through the alternating stack and laterally extending along a first lateral direction; and
a memory stack structure including a memory film and a vertical semiconductor channel extending through the alternating stack, having a pair of first sidewalls that contact sidewalls of the pair of separator dielectric structures, and having a pair of second sidewalls that protrude outward along a second lateral direction, wherein the first sidewalls are laterally recessed inward from substantially vertical edges of the pair of second sidewalls,
wherein the vertical semiconductor channel comprises:
a pair of convex outer sidewalls that are separated from a respective second sidewall of the memory stack structure by a thickness of the memory film; and
a pair of concave outer sidewalls that are separated from a respective first sidewall of the memory stack structure by the thickness of the memory film.

14. The memory device of claim 13, wherein:
the first sidewalls have concave surfaces that extend vertically; and
the second sidewalls have convex surfaces that extend vertically.

15. The memory device of claim 14, further comprising a dielectric core having a pair of concave sidewalls that face a respective separator dielectric structure and a pair of convex sidewalls adjoined to the pair of concave sidewalls.

16. The memory device of claim 13, wherein the pair of separator dielectric structures vertically extend from a bottommost layer of the alternating stack to a topmost layer of the alternating stack.

17. The memory device of claim 13, wherein the vertical edges of the second sidewalls of the memory stack structure adjoin a respective sidewall of the pair of separator dielectric structures at an angle in a range from 45 degrees to 135 degrees.

18. The memory device of claim 13, wherein an angle between the first lateral direction and the second lateral direction is in a range from 60 degrees to 120 degrees.

19. The memory device of claim 13, wherein a lateral separation distance between the pair of convex outer sidewalls is greater than a lateral separation distance between the pair of concave outer sidewalls.

20. The memory device of claim 13, wherein
the insulating layers comprise a first silicon oxide material having a first etch rate in buffered hydrofluoric acid;
the pair of separator dielectric structures comprises a second silicon oxide material having a second etch rate in buffered hydrofluoric acid; and
a ratio of the first etch rate to the second etch rate is in a range from 2 to 5.

21. The memory device of claim 13, wherein:
the insulating layers comprise a material selected from borosilicate glass, phosphosilicate glass, borophosphosilicate glass, fluorosilicate glass, organosilicate glass, and combinations thereof; and
the pair of separator dielectric structures comprise undoped silicate glass.

22. The memory device of claim 13, wherein the memory film comprises:
a tunneling dielectric contacting, and laterally surrounding, the vertical semiconductor channel; and
a charge trapping layer that laterally surrounds the tunneling dielectric.

23. The memory device of claim 22, wherein the memory film further comprises a blocking dielectric laterally surrounding the charge trapping layer and having the pair of first sidewalls and the pair of second sidewalls of the memory stack structure.

24. The memory device of claim 13, wherein:
the memory device comprises a vertical NAND device located over the substrate;
the electrically conductive layers comprise, or are electrically connected to, a respective word line of the NAND device;
the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *